United States Patent

Suzuki

[11] Patent Number: 6,084,405
[45] Date of Patent: Jul. 4, 2000

[54] TRANSDUCER UTILIZING GIANT MAGNETORESISTANCE EFFECT AND HAVING A FERROMAGNETIC LAYER PINNED IN A DIRECTION PERPENDICULAR TO A DIRECTION OF A SIGNAL MAGNETIC FIELD

[75] Inventor: Tetsuhiro Suzuki, Tokyo, Japan

[73] Assignee: NEC Corporation, Tokyo, Japan

[21] Appl. No.: 08/978,640

[22] Filed: Nov. 26, 1997

[30] Foreign Application Priority Data

Nov. 26, 1996 [JP] Japan .................................. 8-314663

[51] Int. Cl.[7] .................................................. G01R 33/02
[52] U.S. Cl. ...................... 324/252; 360/113; 338/32 R
[58] Field of Search ............................ 324/252, 207.21;
360/113; 338/32 R

[56] References Cited

U.S. PATENT DOCUMENTS 5,206,590  4/1993  Dieny et al. ............................ 324/252
5,705,973  1/1998  Yuan et al. ......................... 324/207.21

FOREIGN PATENT DOCUMENTS 2-61572    3/1990   Japan .
4-358310  12/1992   Japan .
8-180334   7/1996   Japan .

OTHER PUBLICATIONS

Ching Tsang et al., "Design, fabrication & testing of spin–valve read heads for high density recording", pp. 3801–3806, IEEE Transactions On Magnetics, vol. 30, No. 6, Nov. 1994.

Primary Examiner—Jay Patidar
Attorney, Agent, or Firm—Young & Thompson

[57] ABSTRACT

A magnetoresistive transducer showing a giant magnetoresistance effect has a multi-layer structure including first and second ferromagnetic layers separated by a non-magnetic layer. The second ferromagnetic layer has a magnetization pinned in a direction perpendicular to a direction of a signal magnetic field. An anti-ferromagnetic layer adjacent to the second ferromagnetic layer pins magnetization of the second ferromagnetic layer in a direction perpendicular to a direction of a signal magnetic field so that magnetizations of the first and second ferromagnetic layers have components perpendicular to the signal magnetic field and those components are anti-parallel to each other.

47 Claims, 15 Drawing Sheets exchange coupling magnetic field external magnetic field H

TRANSDUCER UTILIZING GIANT MAGNETORESISTANCE EFFECT AND HAVING A FERROMAGNETIC LAYER PINNED IN A DIRECTION PERPENDICULAR TO A DIRECTION OF A SIGNAL MAGNETIC FIELD

BACKGROUND OF THE INVENTION

The present invention relates to a magnetoresistive transducer, and more particularly to a magnetoresistive read head utilizing a giant magnetoresistance effect for sensing signal magnetic fields to read out magnetic information stored in a magnetic recording medium The magnetoresistive head utilizing the magnetoresistive effect has a high sensitivity to signal magnetic fields, for which reason the magnetoresistive head is used for a high density magnetic recording. In the prior arts, it had been known that the magnetoresistive head has a magnetic layer which exhibits an anisotropic magnetoresistive effect. Such anisotropic magnetoresistive head has an electrical resistance which varies in proportion to a square of cosine of an angle defined between a direction of a current to be supplied to a magnetoresistive material and a direction of magnetization of the magnetoresistive material.

The magnetic recording device allows the magnetoresistive material to vary in magnetization direction in accordance with signal magnetic fields from a magnetic recording medium. This variation in magnetization direction of the magnetoresistive material causes a variation in resistance of the magnetoresistive material and also causes variations in current and voltage, for which reason the magnetic recording device can read out magnetic data or information from the magnetic recording medium.

Recently, in place of the above a giant magnetoresistance effect was discovered in a multi-layered structure wherein a non-magnetic layer is sandwiched between ferromagnetic metal layers. This giant magnetoresistance effect is caused in a multi-layer structure of Fe/Cr or Co/Cu showing an anti-ferromagnetic coupling. This giant magnetoresistance effect is also caused in another multi-layer structure of a free ferromagnetic layer/non-magnetic layer/pinned ferromagnetic layer. In the giant magnetoresistance effect, an electrical resistance varies in proportional to a cosine of an angle defined between magnetization directions of two ferromagnetic layers separated by a non-magnetic layer, but independently from a current direction.

In Japanese laid-open patent publication No. 4-358310, it is disclosed that the magnetic head utilizes a giant magnetoresistance effect. FIG. 1 is a schematic view illustrative of a conventional magnetoresistive sensor utilizing the giant magnetoresistance effect for sensing signal magnetic fields. The conventional magnetoresistive sensor comprises first and second ferromagnetic layers 101 and 103 separated by a non-magnetic metal layer 102 and an anti-ferromagnetic layer 104 adjacent to the second ferromagnetic layer 103 for pinning magnetization of the second ferromagnetic layer 103 by exchange-coupling. The first ferromagnetic layer 101 has a magnetization direction which is perpendicular to the pinned magnetization direction of the second ferromagnetic layer 103. Namely, the first ferromagnetic layer 101 serves as a ferromagnetic free layer. The second ferromagnetic layer 103 serves as a ferromagnetic pinned layer.

The largest linear response and the widest dynamic range can be obtained when the second ferromagnetic layer 103 has a pinned magnetization direction which is parallel to a direction of signal magnetic fields whilst the first ferromagnetic layer 101 has a magnetiztion direction which is perpendicular to the direction of the signal magnetic fields. Only the magnetization direction of the first ferromagnetic layer 101 is free to rotate so that an angle defined between the magnetization directions of the first and second ferromagnetic layers 101 and 103 varies. This variation in angle defined between the magnetization directions of the first and second ferromagnetic layers 101 and 103 causes a variation in electrical resistance, for which reason the variation in electrical resistance is detectable.

The above magnetic head or magnetic transducer utilizing the giant magnetoresistance effect has the following problems. It is required that the magnetization direction of the second ferromagnetic layer 103 is pinned in a direction parallel to the direction of the signal magnetic fields. The anti-ferromagnetic layer 104 is used for pinning the magnetization direction of the second ferromagnetic layer 103. Those layers are required to be heated up to a temperature near a Neel temperature for magnetic polarization in a direction parallel to the direction of the signal magnetic fields Ps. Those temperature rising and subsequent magnetic polarization processes might provide influences to the magnetic properties of the other parts of the magnetic head or transducer.

FIG. 2 is a fragmentary cross sectional elevation view illustrative of a magnetic head comprising an inductive portion for recording informations into a magnetic recording medium 100 (FIG. 1) and a giant magnetoresistance effect sensor portion for reading out the informations from the magnetic recording medium 100. The magnetic head normally has not only the magnetoresistive sensing portion but also the following elements. Bottom and top shielding layers 111 and 112 are provided for improvement in recording density in bit direction. Bottom and top pole layers 113 and 114 are provided for recording signals into the magnetic medium 100. A second anti-ferromagnetic layer 108 is further provided for generating a longitudinal bias magnetic field. As well illustrated in FIG. 2, the top shielding layer 112 and the bottom pole layer 113 are a common single layer.

In the high frequency range, in order to record and reproduce the magnetic signal into the magnetic medium, it is required that easy-axis of the top and bottom shielding layers 112 and 111 as well as the top and bottom pole layers 114 and 113 is perpendicular to the direction of the signal magnetic fields. Those magnetic layers are controlled in magnetic anisotropy so as to have a magnetization easy axis in a desired direction by growth of the magnetic layers in a magnetic field. However, the temperature rising and subsequent magnetic polarization processes for the anti-ferromagnetic layer 104 may disturb the magnetization easy-axis.

Namely, if the temperature rising and subsequent magnetic polarization processes for the anti-ferromagnetic layer 104 are made immediately after the anti-ferromagnetic layer 104 was formed, then the magnetization easy-axis of the bottom shielding layer 111 is disturbed. Even if the temperature rising and subsequent magnetic polarization processes for the anti-ferromagnetic layer 104 are made immediately after all of the layers were formed, then the magnetization easy-axis of the top and bottom shielding layers 112 and 111 as well as the top and bottom pole layers 114 and 113 is disturbed. As a result, over-write characteristic is deteriorated and a half width of the reproduced waveform is widened.

By contrast, the magnetization easy axis of the top and bottom shielding layers 112 and 111 as well as the top and bottom pole layers 114 and 113 can return to the direction perpendicular to the signal magnetic fields by applying a magnetic field in a direction perpendicular to the direction of the signal magnetic field and further optionally increasing a temperature of the layer, However, those processes for applying the magnetic field in the direction vertical to the signal magnetic fields and any subsequent temperature rising might weaken the pinning of the magnetization direction of the second ferromagnetic layer 103.

Even as described above the second anti-ferromagnetic layer 108 is provided for domain stabilization of the first ferromagnetic layer 101. The magnetic anisotropy of the second anti-ferromagnetic layer 108 is also oriented in a direction perpendicular to the signal magnetic fields "Ps", for which reason the temperature rising and magnetic polarization for pinning the second ferromagnetic layer 103 might disturb the magnetization easy axis.

In the above circumstances, it had been required to develop a novel magnetoresistive head utilizing a giant magnetoresistance effect and having a large linear responsibility without strong pinning of the magnetization in parallel to the signal magnetic fields.

SUMMARY OF THE INVENTION

Accordingly, it is an object of the present invention to provide a novel magnetoresistive transducer utilizing a giant magnetoresistive effect, which is free from the above problems and disadvantages.

It is a further object of the present invention to provide a novel magnetoresistive transducer utilizing a giant magnetoresistive effect, which exhibits large linear responsiveness.

It is a still further object of the present invention to provide a novel magnetoresistive transducer utilizing a giant magnetoresistive effect, which is free of any strong pinning of the second ferromagnetic layer in the direction parallel to the signal magnetic fields.

It is yet a further object of the present invention to provide a method of using a novel magnetoresistive transducer utilizing a giant magnetoresistive effect, which is free from the above problems and disadvantages.

It is a further more object of the present invention to provide a method of using a novel magnetoresistive transducer utilizing a giant magnetoresistive effect, which exhibits large linear responsiveness.

It is still a further object of the present invention to provide a novel method of using a novel magnetoresistive transducer utilizing a giant magnetoresistive effect, which is free of any strong pinning of the second ferromagnetic layer in the direction parallel to the signal magnetic fields.

The above and other objects, features and advantages of the present invention will be apparent from the following descriptions.

The present invention provides a magnetoresistive transducer showing a giant magnetoresistance effect. The magnetoresistive transducer has a multi-layer structure comprising first and second ferromagnetic layers separated by a non-magnetic layer, wherein the second ferromagnetic layer has a magnetization pinned in a direction perpendicular to a direction of a signal magnetic field.

BRIEF DESCRIPTION OF THE DRAWINGS

Preferred embodiments according to the present invention will be described in detail with reference to the accompanying drawings.

Figure 1:
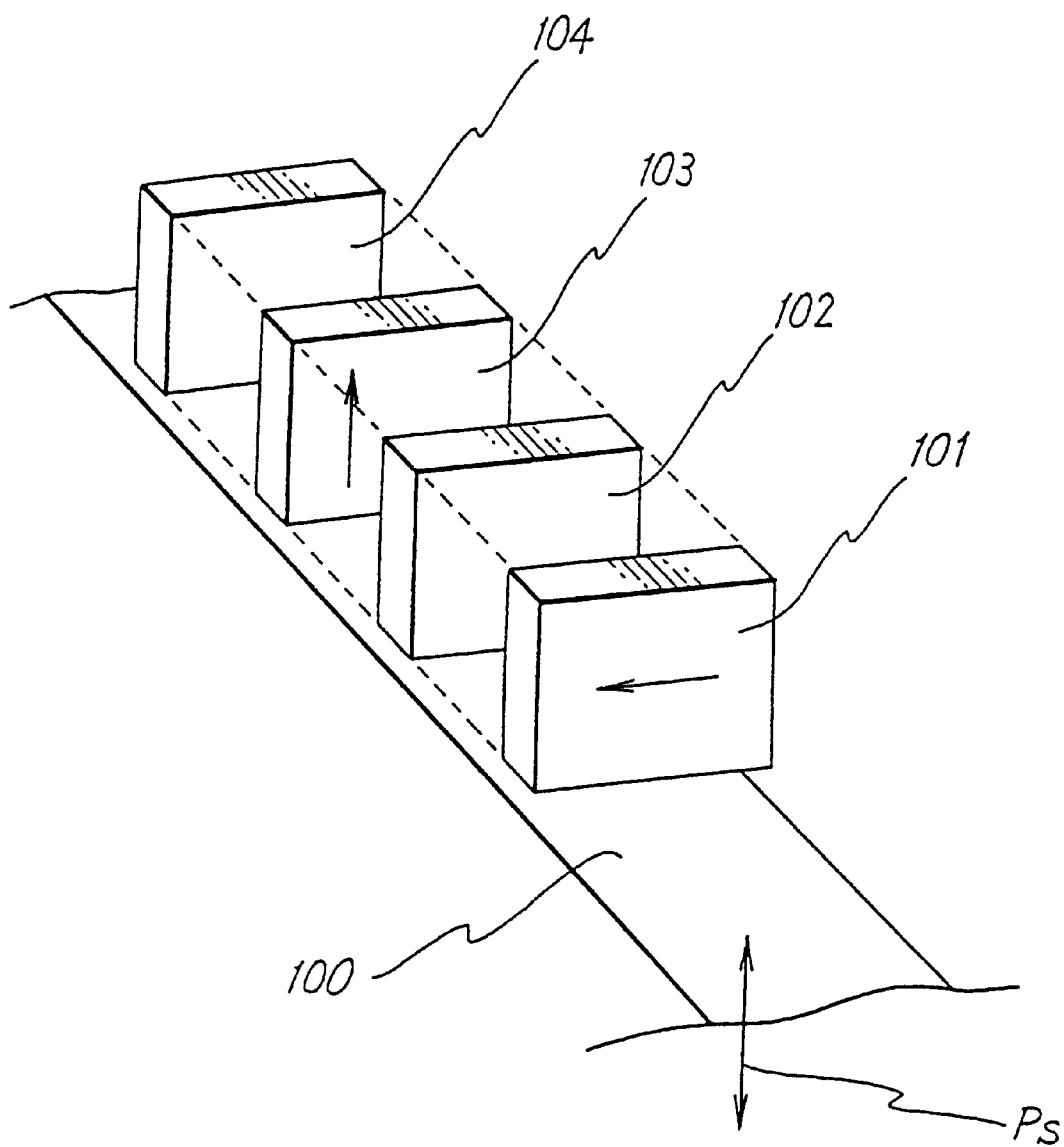
FIG. 1 is a schematic view illustrative of a conventional magnetoresistive sensor utilizing the giant magnetoresistance effect for sensing signal magnetic fields.
Figure 2:
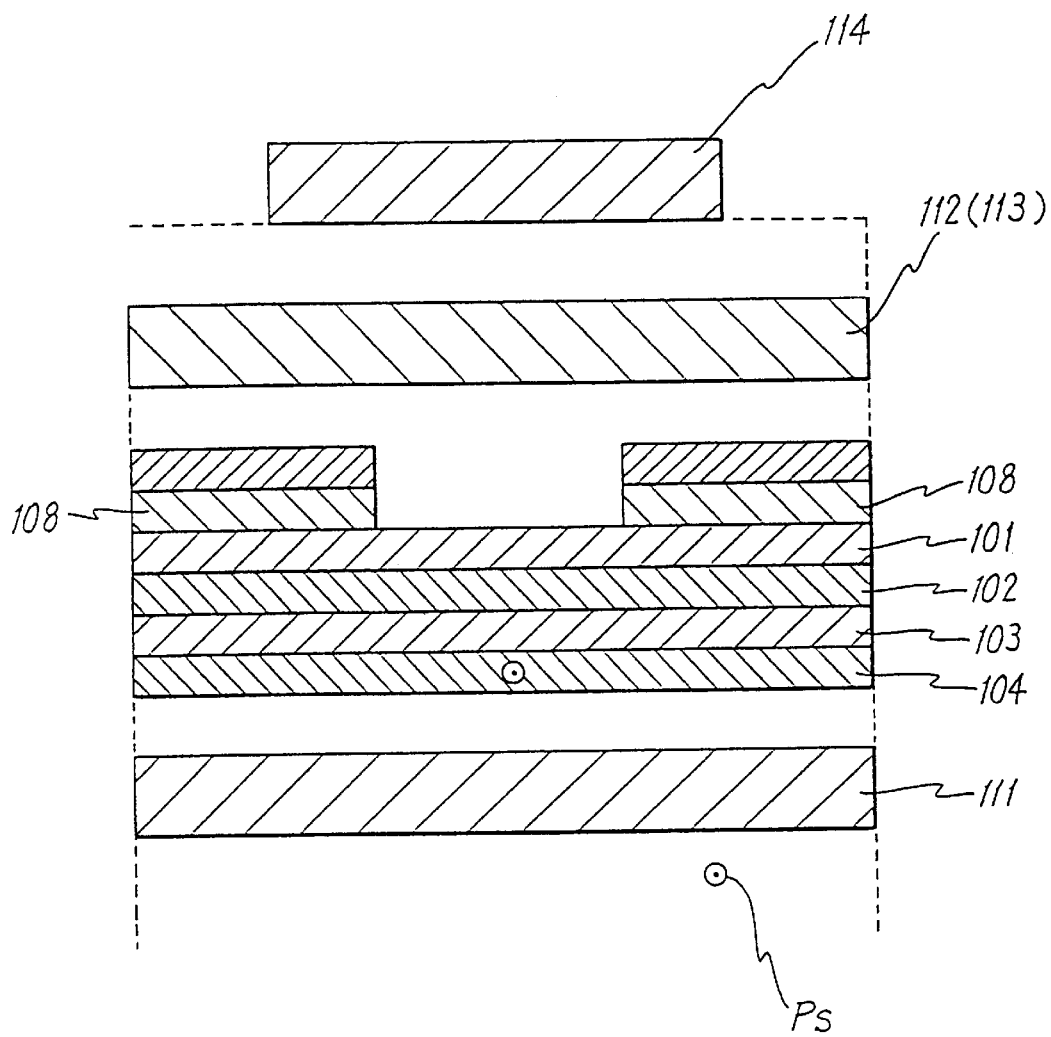
FIG. 2 is a fragmentary cross sectional elevation view illustrative of a magnetic head comprising an inductive portion for recording informations into a magnetic recording medium 100 and a giant magnetoresistance effect sensor portion for reading out the informations from the magnetic recording medium 100.
Figure 3:
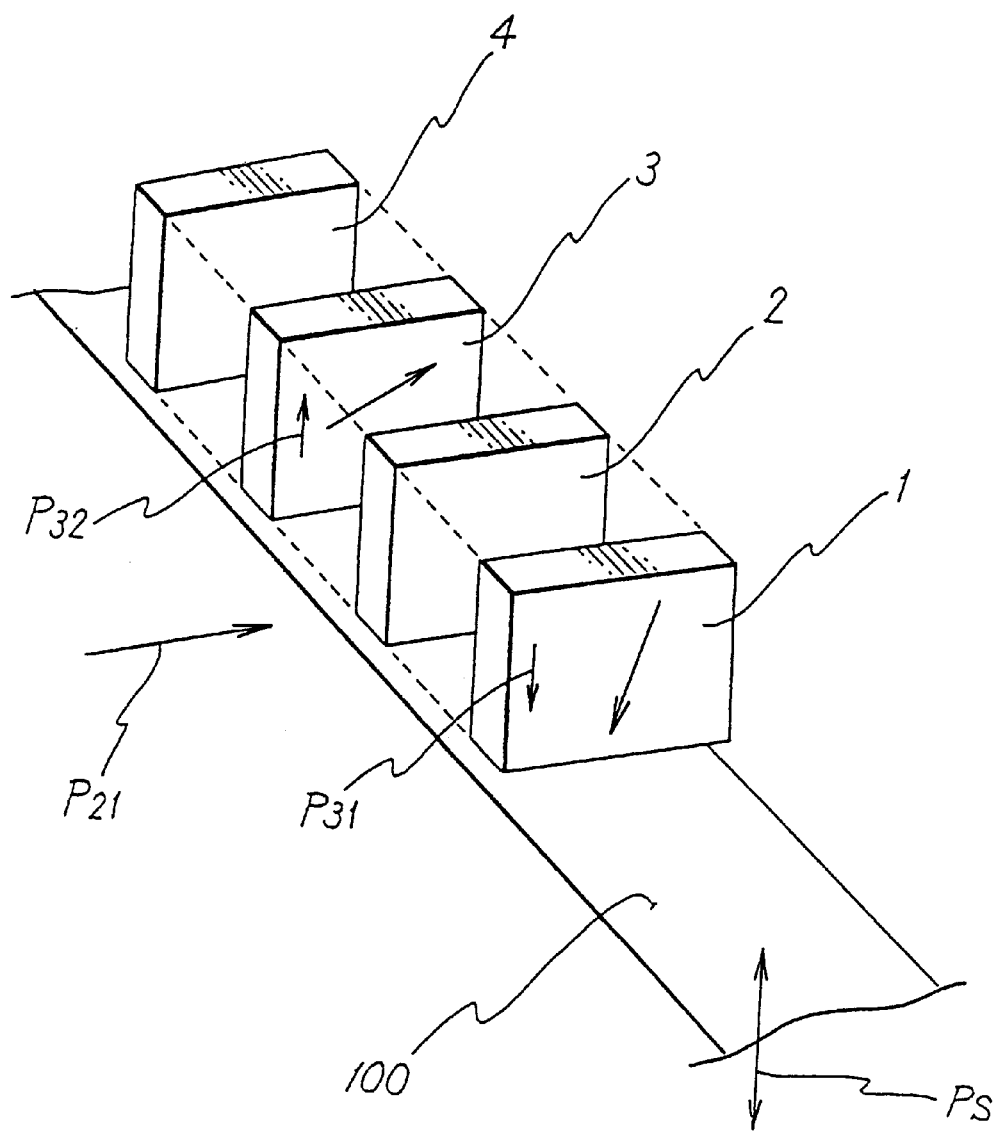
FIG. 3 is a schematic view illustrative of a novel magnetoresistive sensor utilizing the giant magnetoresistance effect for sensing signal magnetic fields in accordance with a first present invention.

FIG, 10 is a fragmentary cross sectional elevation view illustrative of a novel magnetoresistive sensor utilizing the giant magnetoresistance effect for sensing signal magnetic fields of FIG. 3 in a first embodiment according to the present invention.

Figure 11:
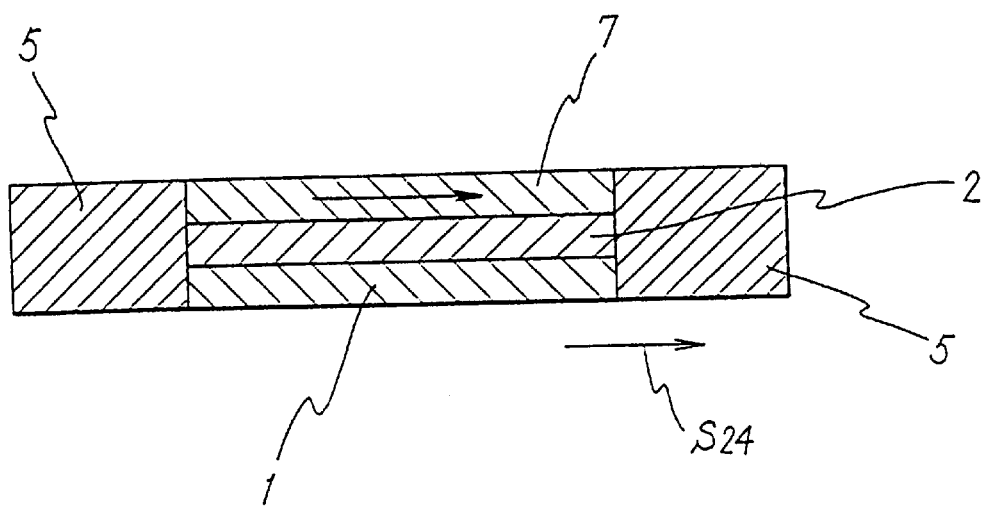

FIG. 11 is a fragmentary cross sectional elevation view illustrative of a novel magnetoresistive sensor utilizing the giant magnetoresistance effect for sensing signal magnetic fields in a second embodiment according to the present invention.

Figure 7:
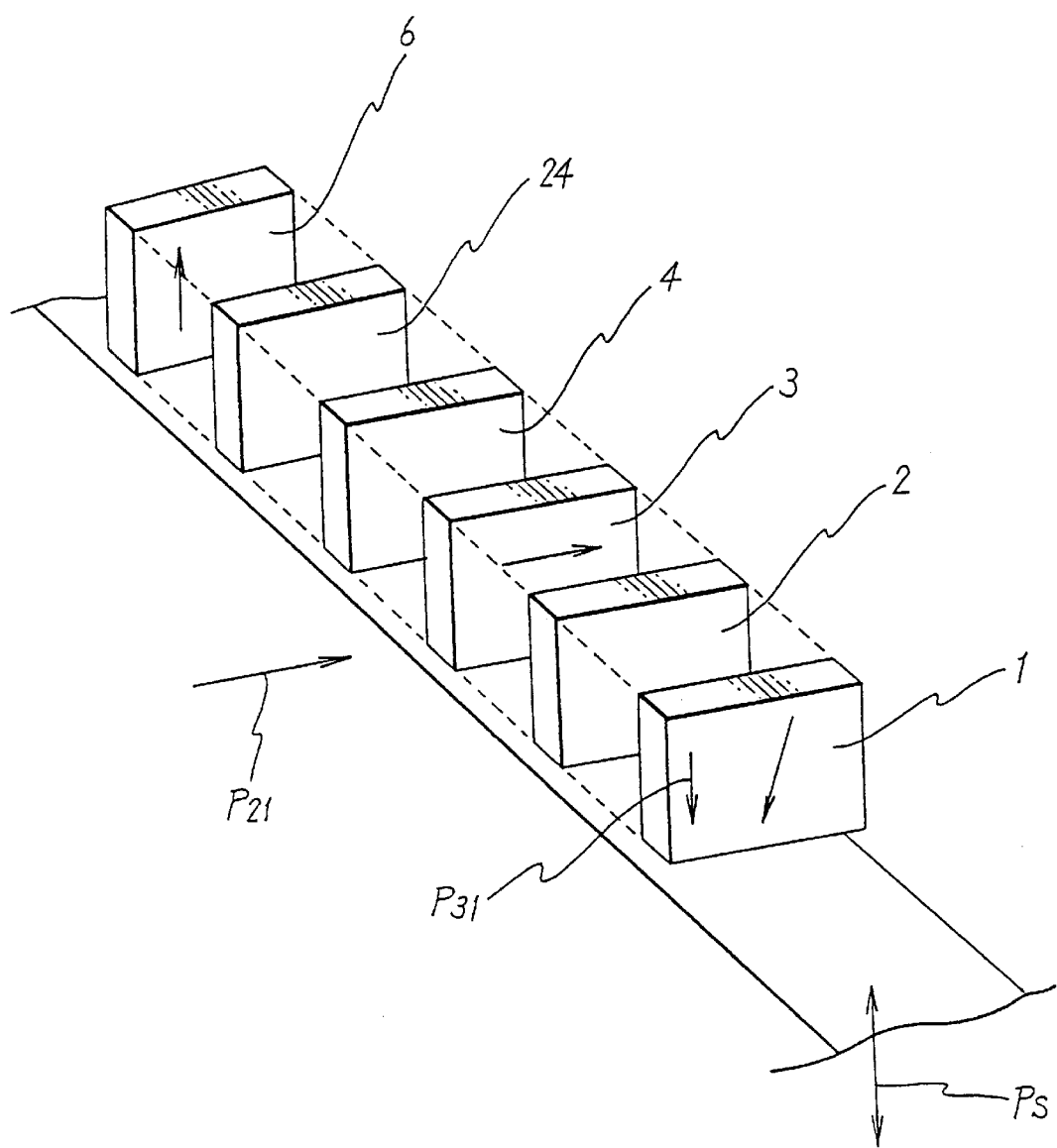
FIG. 7 is a schematic view illustrative of a novel magnetoresistive sensor utilizing the giant magnetoresistance effect for sensing signal magnetic fields according to the second present invention.
Figure 12:
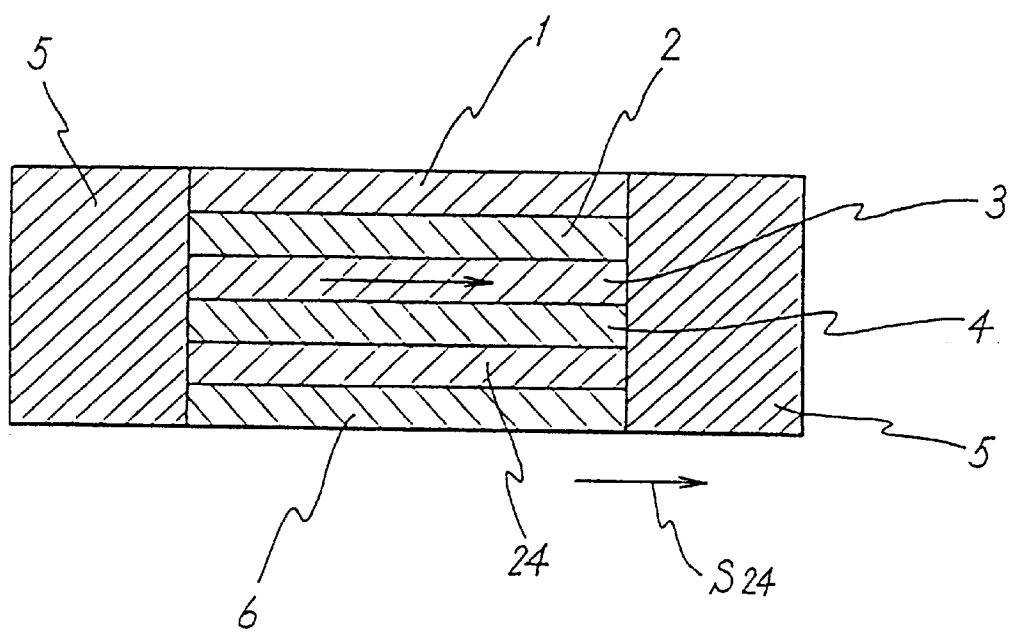

FIG. 12 is a fragmentary cross sectional elevation view illustrative of a novel magnetoresistive sensor utilizing the giant magnetoresistance effect for sensing signal magnetic fields of FIG. 7 in a third embodiment according to the present invention.

Figure 9:
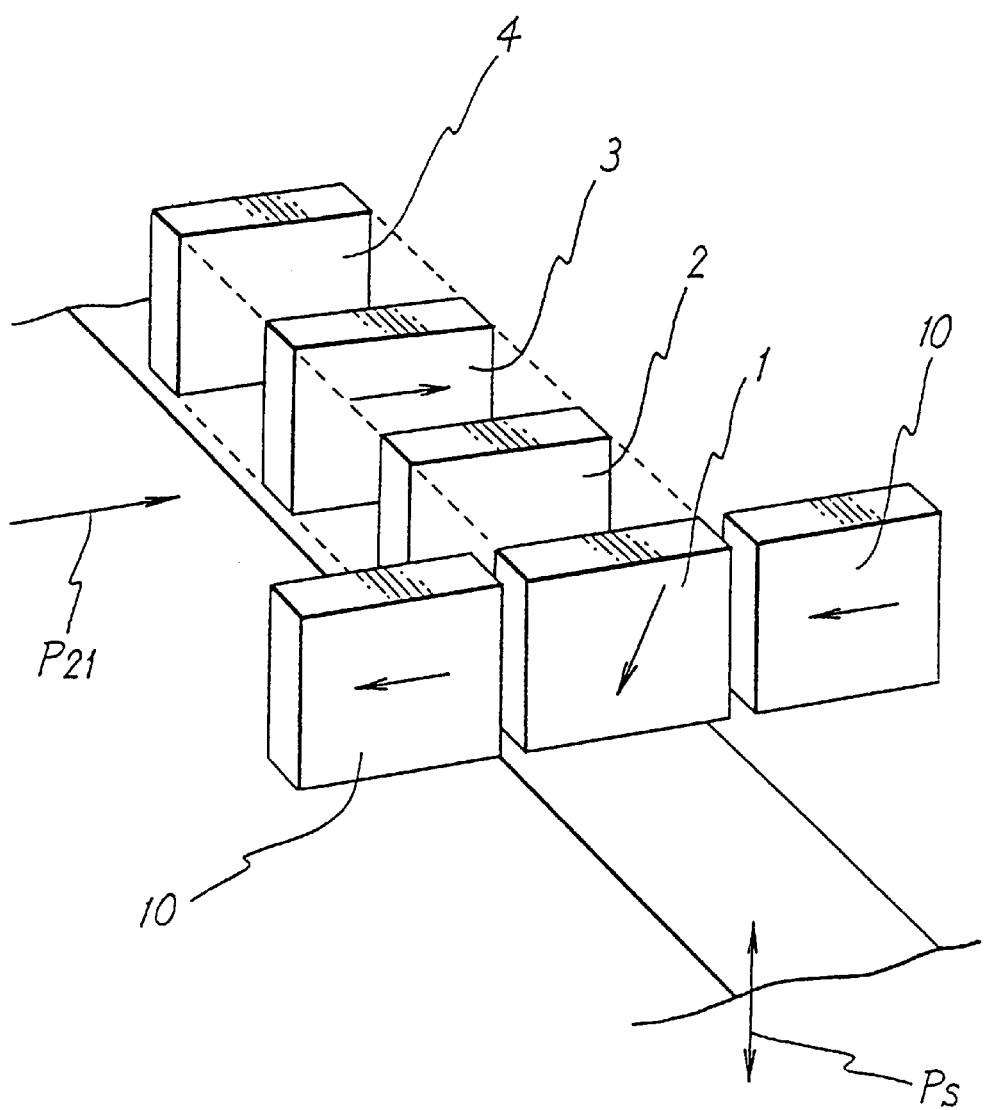
FIG. 9 is a schematic view illustrative of a novel magnetoresistive sensor utilizing the giant magnetoresistance effect for sensing signal magnetic fields according to the third present invention.
Figure 13:
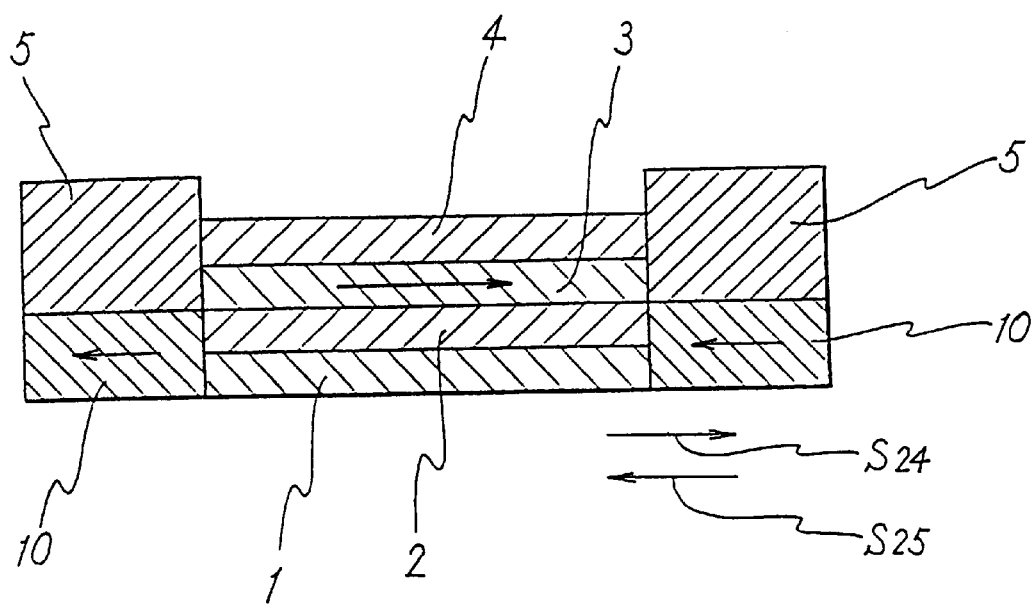

FIG. 13 is a fragmentary cross sectional elevation view illustrative of a novel magnetoresistive sensor utilizing the giant magnetoresistance effect for sensing signal magnetic fields of FIG. 9 in a fourth embodiment according to the present invention.

Figure 14:
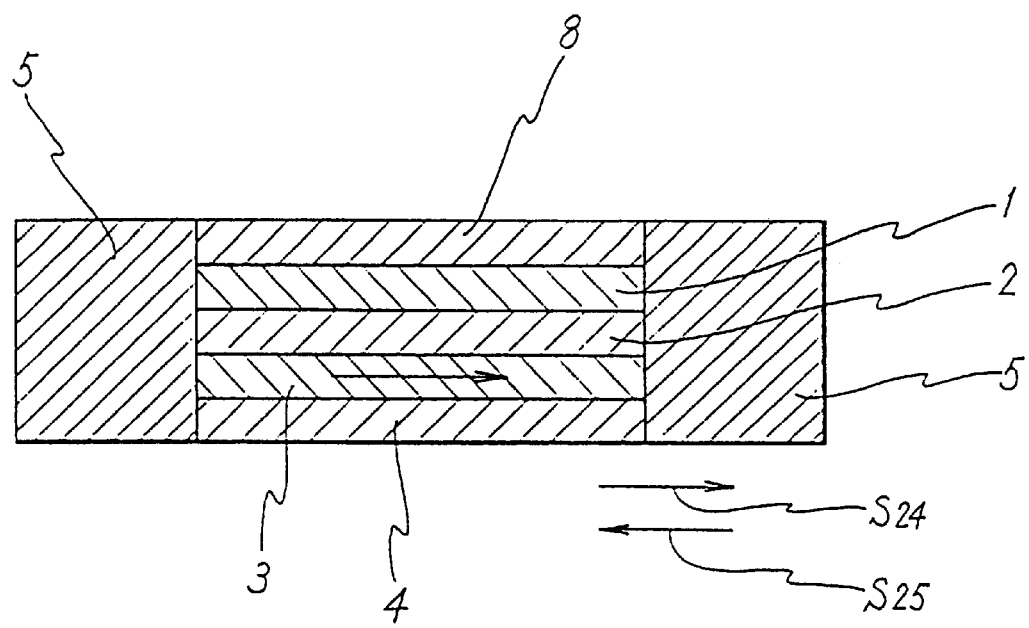

FIG. 14 is a fragmentary cross sectional elevation view illustrative of a novel magnetoresistive sensor utilizing the giant magnetoresistance effect for sensing signal magnetic fields in a fifth embodiment according to the present invention.

Figure 15:
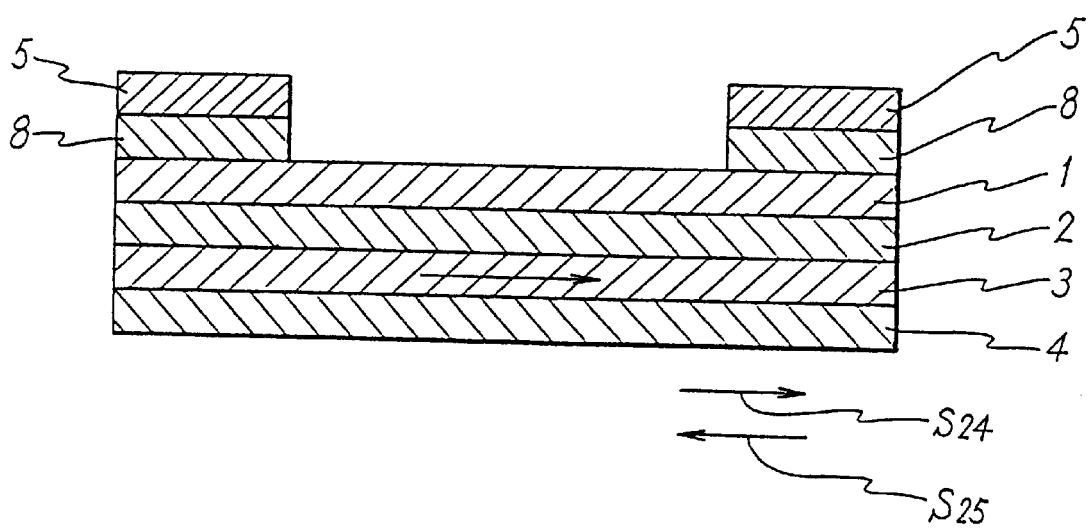

FIG. 15 is a fragmentary cross sectional elevation view illustrative of a novel magnetoresistive sensor utilizing the giant magnetoresistance effect for sensing signal magnetic fields in a sixth embodiment according to the present invention.

DESCRIPTION OF THE PREFERRED EMBODIMENT

The present invention provides a magnetoresistive transducer showing a giant magnetoresistance effect. The magnetoresistive transducer has a multi-layer structure comprising first and second ferromagnetic layers separated by a non-magnetic layer, wherein the second ferromagnetic layer has a magnetization pinned in a direction perpendicular to a direction of a signal magnetic field.

The second ferromagnetic layer may have a track edge at which a magnetic pole is caused for generating a longitudinal bias magnetic field which keeps the first ferromagnetic layer in a single domain state.

Magnetizations of the first and second ferromagnetic layers may have components perpendicular to a signal magnetic field and those components are anti-parallel to each other.

A resistance of the multi-layer structure may vary mainly dependent upon a magnetization rotation of the second ferromagnetic layer.

The first ferromagnetic layer may be thinner in thickness than the second ferromagnetic layer.

An anti-ferromagnetic layer may be provided adjacent to the second ferromagnetic layer for pinning magnetization of the second ferromagnetic layer in the direction perpendicular to the direction of the signal magnetic field.

The anti-ferromagnetic layer may be made of one selected from the group consisting of materials mainly including at least one of FeMn, NiMn and IrMn, and materials mainly including at least one of NiO, CoO and FeO.

At least a permanent magnet layer may be provided adjacent to the second ferromagnetic layer for pinning magnetization of the second ferromagnetic layer in the direction vertical to the direction of the signal magnetic field.

The permanent magnet layer may be made of one selected from the group consisting of alloys including at least one of Co, Cr and Pt.

The second ferromagnetic layer may comprise a hard magnetic layer.

The hard magnetic layer may be made of one selected from the group consisting of Co and Co-based alloys.

A magnetic field applied for pinning magnetization of the second ferromagnetic layer in the direction perpendicular to the direction of the signal magnetic field may be in the range of 80–160 Oe.

An electrically conductive material may be provided in the vicinity of the second ferromagnetic layer for pinning magnetization of the second ferromagnetic layer in the direction perpendicular to the direction of the signal magnetic field.

Each of the first and second ferromagnetic layers may be made of one selected from the group consisting of Fe, Co, Ni, and alloys based upon at least one of Fe, Co and Ni.

The non-magnetic layer may be made of one selected from the group consisting of Cu, Ag, Au, and alloys based upon at least one of Cu, Ag and Au.

It is also possible to further provide a layer in the vicinity of the first and second ferromagnetic layers for applying a transverse bias magnetic field to the first and second ferromagnetic layers. The laser may be positioned in the same side as the second ferromagnetic layer with reference to the non-magnetic layer. The layer may comprise laminations of a soft magnetic layer and a non-magnetic layer. The layer may comprise a non-magnetic metal layer. The layer may comprise a permanent magnet layer.

It is also possible to further provide a layer adjacent to the first ferromagnetic layer for applying a vertical magnetic field. A direction of the vertical magnetic field may be anti-parallel to a direction toward which the magnetization of the second ferromagnetic layer is pinned. The layer may comprise at least a permanent magnet layer. The layer may be provided in contact directly with the first ferromagnetic layer. The layer may comprise an anti-ferromagnetic layer in contact directly with the first ferromagnetic layer except at sensing portion.

A first aspect of the present invention will be described in detail with reference to FIGS. 3 through 6. A magnetoresistive head includes a magnetic sensor portion which comprises a first ferromagnetic layer 1, a non-magnetic metal layer 2 adjacent to the first ferromagnetic layer 1, a second ferromagnetic layer 3 adjacent to the non-magnetic metal layer 2 and an anti-ferromagnetic layer 4 adjacent to the second ferromagnetic layer 3. The anti-ferromagnetic layer 4 adjacent to the second ferromagnetic layer 3 provides the second ferromagnetic layer 3 with a pinning magnetic field in a direction perpendicular to a direction of signal magnetic fields so that a magnetization of the second ferromagnetic layer 3 is incompletely or weakly pinned in the direction perpendicular to the direction of signal magnetic fields.

No element is provided for supplying a vertical bias magnetic field which keeps the first ferromagnetic layer 1 in a single domain state. Materials for the first and second ferromagnetic layers 1 and 3 and the non-magnetic metal layer 2 may be selected so that the sandwiching structure of the first and second ferromagnetic layers 1 and 3 and the non-magnetic metal layer 2 sandwiched between them exhibits the giant magnetoresistance effect.

For example, each of the first and second ferromagnetic layers 1 and 3 may be mad of Fe, Co, Ni, and alloys thereof. The non-magnetic metal layer 2 may be made of Cu, Ag, Au and alloys thereof. The anti-ferromagnetic layer 4 may be made of FeMn, NiMn, NiO, CoO, and FeO.

The following descriptions will focus on magnetization of the first and second ferromagnetic layers 1 and 3 when the signal magnetic field is zero. In this case, a current flowing through the sensor portion applies the first ferromagnetic layer 1 with a magnetic field P31 in a downward direction and also applies the second ferromagnetic layer 3 with a magnetic field P32 in an upward direction opposite to the magnetic field P31. Those magnetic fields P31 and P32 cause the first and second ferromagnetic layers 1 and 3 to show magnetization rotation, provided that the magnetization direction of the second ferromagnetic layer 3 is weakly pinned by the exchange coupling with the anti-ferromagnetic layer 4. For this reason, the second ferromagnetic layer 3 is smaller in the degree of the magnetization rotation than the first ferromagnetic layer 1.

A magnetic pole is caused at a track edge of the second ferromagnetic layer 3. This magnetic pole applies the first ferromagnetic layer 1 with a longitudinal bias magnetic field in an opposite direction to the magnetization direction of the second ferromagnetic layer 3. This longitudinal bias magnetic field keeps the first ferromagnetic layer 1 in the single domain state. Further, the magnetization of the first ferromagnetic layer 1 has a component perpendicular to the signal magnetic field, wherein this perpendicular component is oriented in an opposite direction to a component to the signal magnetic field of the second ferromagnetic layer 3. Namely, the magnetizations of the first and second ferromagnetic layers 1 and 3 are oriented to have opposite horizontal components to each other wherein the horizontal components are perpendicular to the signal magnetic fields Ps. The second ferromagnetic layer 3 is kept in the single domain state dependent upon the anti-ferromagnetic layer 4.

Subsequently, the magnetization of each of the first and second ferromagnetic layers 1 and 3 will be described when the signal magnetic field Ps is not zero.

Figure 4:
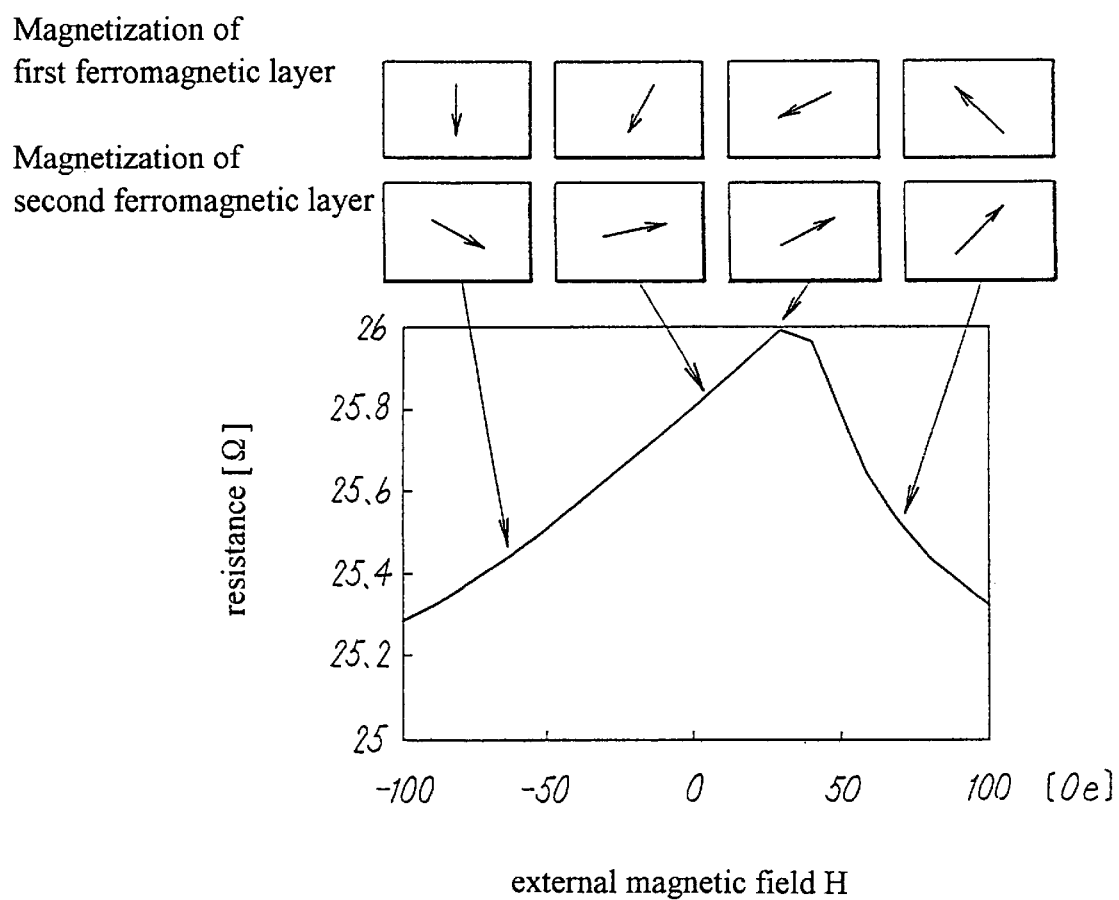
FIG. 4 is a graph illustrative of variations in electrical resistance of a novel magnetoresistive sensor versus external magnetic field with magnetization directions of first and second ferromagnetic layers in a first embodiment according to the present invention.

FIG. 4 is illustrative of variations in electrical resistance of a novel magnetoresistive sensor versus external magnetic field with magnetization directions of the first and second ferromagnetic layers 1 and 3. The upward direction along the magnetic field P32 is the plus direction for the external magnetic field Ps.

As the signal magnetic field Ps increases in minus component, then the first ferromagnetic layer 1 is saturated prior to the second ferromagnetic layer 3 so that mainly the magnetization direction of the second ferromagnetic layer 3 rotates whereby the angle defined between the magnetization directions of the first and second ferromagnetic layers 1 and 3 varies. This variation in the angle defined between the magnetization directions of the first and second ferromagnetic layers 1 and 3 causes variation in resistance of the sensor portion. This variation in resistance of the sensor portion is detected, wherein a current P21 is applied in a direction parallel to interfaces between the layers and vertical to the signal magnetic field Ps.

On the other hand, as the signal magnetic field Ps increases in plus component, then the magnetizations of the first and second ferromagnetic layers 1 and 3 decrease in component parallel to the signal magnetic field Ps. When the magnetization directions of the first and second ferromagnetic layers 1 and 3 are different by 180 degrees from each other or are anti-parallel to each other, the resistance has the maximum value as well shown in FIG. 4. As the signal magnetic field Ps further increases in plus component, then the angle defined between the magnetization directions of the first and second ferromagnetic layers 1 and 3 is reduced from 180 degrees whereby the resistance is also dropped.

If the above multi-layer structured magnetic sensor portion showing the giant magnetoresistance effect is applied to the magnetic head or magnetic transducer, the sensor shows a linear variation in resistance of the sensor and a wide dynamic range of the signal magnetic field Ps are preferable. In this case, the linearity is defined by a magnitude of a pinning magnetic field applied between the second ferromagnetic layer 3 and the anti-ferromagnetic layer 4.

Figure 5:
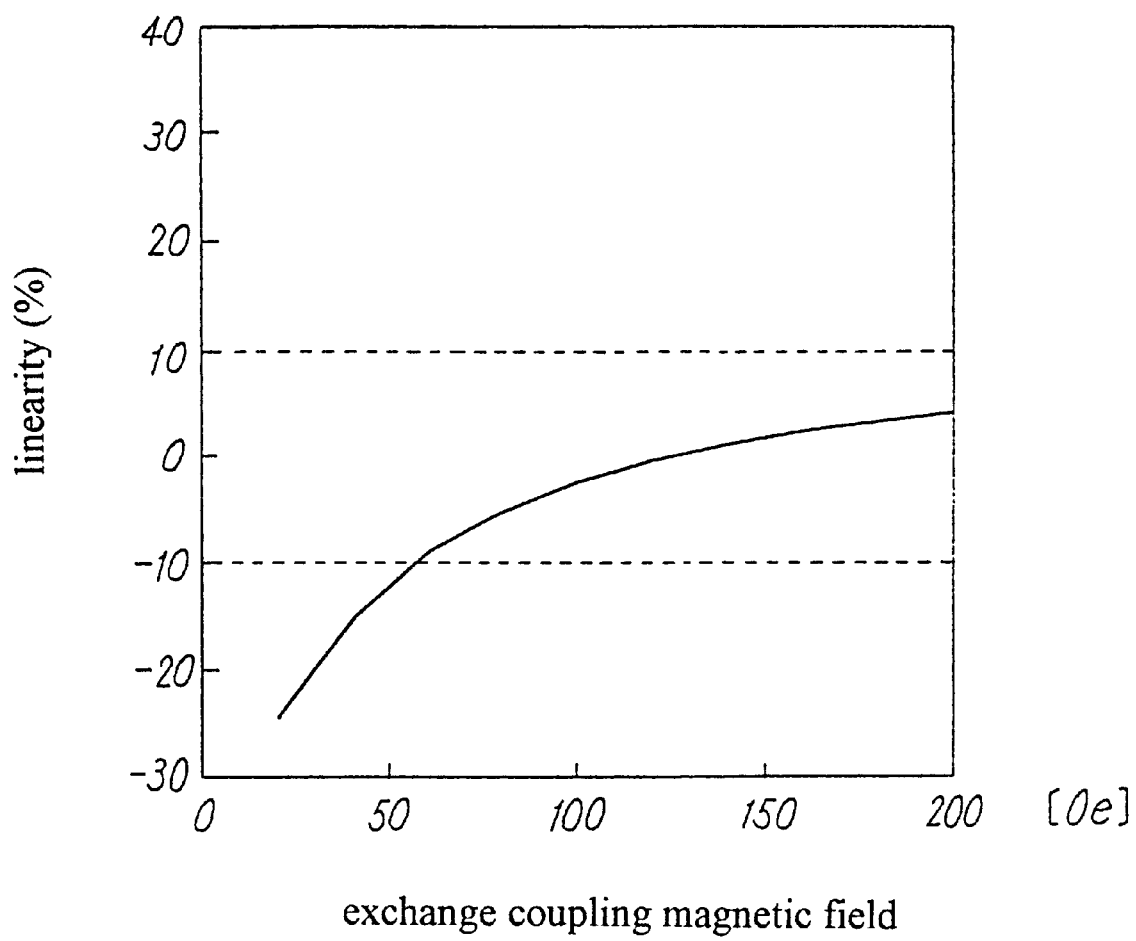
FIG. 5 is a graph illustrative of variations in linearity of dependency upon the pinning magnetic field of a novel magnetoresistive sensor versus exchange coupling magnetic field according to the first present invention.

FIG. 5 is a graph illustrative of variations in linearity of dependency upon the pinning magnetic field of a novel magnetoresistive sensor versus exchange coupling magnetic field, wherein the sensor portion has a track width of 1 micrometer. The linearity curve is obtained by computer simulation, provided that the linearity is defined as follows.

Linearity=(R30−R−30)/(R30+R−30)

where R30 and R−30 are resistance values respectively when the signal magnetic field Ps is 30 Oe and −30 Oe. If the pinning magnetic field is small, the magnetizations of the first and second ferromagnetic layers 1 and 3 are concurrently moved or changed whereby the linearity of dependency upon the pinning magnetic field is thus deteriorated.

On the other hand, if the pinning magnetic field is too large, then the magnetization of the second ferromagnetic layer 3 is hard to rotate, for which reason not only the linearity but also sensitivity are deteriorated. For signal processes, an allowable range of the linearity is ±10%. Thus, a preferable range of the pinning magnetic field is 80–160 Oe.

Figure 6:
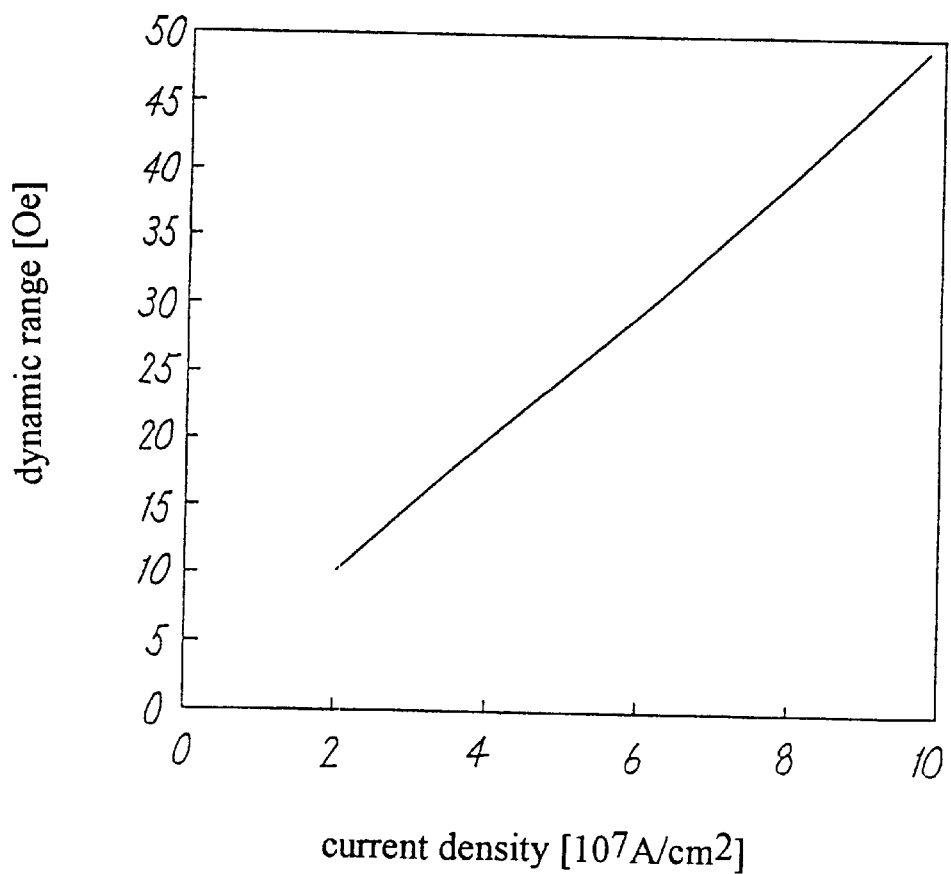
FIG. 6 is a graph illustrative of variations in dynamic range of a novel magnetoresistive sensor versus current density according to the first present invention.

The dynamic range is defined by the signal magnetic field Ps where the resistance has the maximum value or the magnetizations of the first and second ferromagnetic layers 1 and 3 are antiparallel to each other. FIG. 6 is a graph illustrative of variations in dynamic range of a novel magnetoresistive sensor versus current density. The dynamic range increases in proportional to the current density. In the light of ensuring a sufficient dynamic range, a high current density is preferable. However, in the light of suppressing the electromigration, a low current density is preferable.

In order to widen the dynamic range, it is preferable that the magnetization of the first ferromagnetic layer is close to the saturated state in the current magnetic field when the signal magnetic field Ps is zero. It is therefore effective that the first ferromagnetic layer 1 is thinner than the second ferromagnetic layer 3 so as to mainly apply the current magnetic field to the first ferromagnetic layer 1.

As a modification to the above, in place of the anti-ferromagnetic layer 4, a permanent magnet layer may be provided for causing the exchange coupling to apply the pinned magnetic field to the second ferromagnetic layer 3. In this case, a magnetic pole is caused at the track edge. This magnetic pole increases the longitudinal bias magnetic field substantially applied to the first ferromagnetic layer 1.

As a further modification to the above, it is possible to provide a hard magnetic material which has a large coercive force instead of the second ferromagnetic layer 3 and the anti-ferromagnetic layer 4.

The above first aspect of the present invention provides the following advantages. The magnetization of the second ferromagnetic layer 3 is weakly pinned by the anti-ferromagnetic layer 4 in a direction perpendicular to the direction of the signal magnetic field Ps. The ferromagnetic layer 3 is therefore heated up to a temperature near the Neel temperature of the anti-ferromagnetic layer for magnetic polarization in the direction perpendicular to the signal magnetic field, for which reason those temperature rising and magnetic polarization processes provide no influence to the magnetic characteristics of the other parts.

The magnetic pole caused at the track width of the second ferromagnetic layer 3 applies the longitudinal bias magnetic field which keeps the first ferromagnetic layer in the single domain state. It is unnecessary to provide any further anti-ferromagnetic layer and any permanent magnet layer.

A second aspect of the present invention will be described with reference to FIG. 7. A magnetoresistive sensor portion exhibiting the giant magnetoresistive effect comprises a first ferromagnetic layer 1, a non-magnetic metal layer 2 adjacent to the first ferromagnetic layer 1, a second ferromagnetic layer 3 adjacent to the non-magnetic metal layer 2, an anti-ferromagnetic layer 4 adjacent to the second ferromagnetic layer 3, a non-magnetic isolation layer 24 adjacent to the anti-ferromagnetic layer 4 and a soft magnetic layer 6 adjacent to the non-magnetic isolation layer 24.

The non-magnetic isolation layer 24 is provided for cutting off the exchange coupling between the anti-ferromagnetic layer 4 and the soft magnetic layer 6. The soft magnetic layer 6 is magnetized by a current magnetic field in an opposite direction to the direction of the magnetization of the first ferromagnetic layer 1 so as to apply a transverse bias magnetic field to the first and second ferromagnetic layers 1 and 3.

The non-magnetic isolation layer 24 may comprise a metal layer made of Ta, Ti and Cu or may comprise an insulation layer of $SiO_2$ and $Al_2O_3$ and the like. The soft magnetic layer 6 may be made of one of alloys of Ni, Fe and Co with or without an additive or Co-based amorphous metals. The other structure of the magnetoresistive sensor is the same as in the first present invention, for which reason the duplicate descriptions will be omitted.

Figure 8:
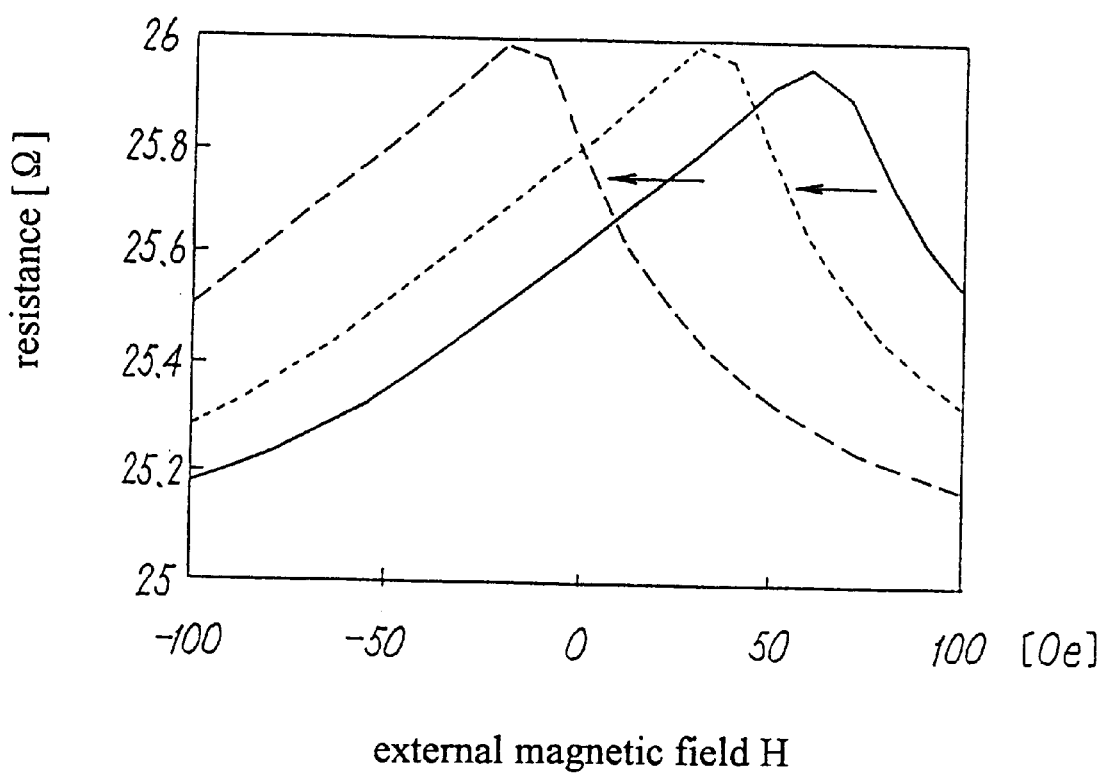
FIG. 8 is a graph illustrative of variations in electrical resistance of a novel magnetoresistive sensor versus external magnetic field with magnetization directions of first and second ferromagnetic layers according to the second present invention.

FIG. 8 is a graph illustrative of variations in electrical resistance of a novel magnetoresistive sensor versus external magnetic field with magnetization directions of first and second ferromagnetic layers. The signal magnetic field is in parallel to the above described signal magnetic field. The direction of the current magnetic field P31 applied to the first ferromagnetic layer 1 is the direction of the plus of the external magnetic field. Since the soft magnetic layer 6 applies the first and second ferromagnetic layers 1 and 3 with the transverse bias magnetic fields in the plus direction, the resistance curve of the real line is shifted from broken lines of the above first present invention shown in FIG. 4. For those reasons, a sufficiently wide dynamic range can been obtained even in a relatively small current density. The dynamic range is controllable by controlling the thickness of the soft magnetic layer 6.

The soft magnetic layer 6 and the non-magnetic isolation layer 24 are provided in order to apply the transverse bias magnetic field to the first and second ferromagnetic layers 1 and 3.

As a modification to the above second present invention, it is possible to provide a permanent magnet layer often used for anisotropic magnetoresistance effect or provide a shunt layer instead of the soft magnetic layer 6 and the non-magnetic isolation layer 24.

As a further modification to the above, a layer for applying the transverse bias magnetic field may be provided adjacent to the first ferromagnetic layer 1. In this case, the first and second ferromagnetic layers 1 and 3 receive the transverse bias magnetic field in the minus direction, for which reason the resistance curve is further shifted in the minus direction up to a broken line.

Since the layer applying the transverse bias magnetic field is further provided in addition to the structure of the first present invention for the purpose of widening the dynamic range.

A third aspect of the present invention will be described with reference to FIG. 9. A magnetoresistive sensor portion exhibiting the giant magnetoresistive effect comprises a first ferromagnetic layer 1, a non-magnetic metal layer 2 adjacent to the first ferromagnetic layer 1, a second ferromagnetic layer 3 adjacent to the non-magnetic metal layer 2, an anti-ferromagnetic layer 4 adjacent to the second ferromagnetic layer 3, and permanent magnet layers 10 at opposite sides of the first ferromagnetic layer 1.

The first ferromagnetic layer 1, the non-magnetic metal layer 2, the second ferromagnetic layer 3 and the anti-ferromagnetic layer 4 are the same as in the first present invention. The permanent magnet layers 10 are provided for applying the longitudinal bias magnetic field to the first ferromagnetic layer 1 to keep the first ferromagnetic layer 1 in the single domain state.

It is preferable that the direction of the longitudinal bias magnetic field is the same as the magnetic field caused by the magnetic pole at the track edge of the second ferromagnetic layer 3 because the if the magnetization directions of the first and second ferromagnetic layers 1 and 3 are anti-parallel to each other, then the resistance becomes largest. The permanent magnet layers 10 may be made of Co, Cr and alloys including Pt.

As a modification to the above third present invention, instead of the permanent magnet layers 10, an anti-ferromagnetic layer may be provided adjacent to the first ferromagnetic layer 1 for applying the longitudinal bias magnetic field to the first ferromagnetic layer 1 to keep the first ferromagnetic layer 1 in the single domain state. In this case, it is required that the exchange coupling between the first ferromagnetic layer 1 and the anti-ferromagnetic layer is smaller than the exchange coupling between the second ferromagnetic layer 3 and the anti-ferromagnetic layer 4.

As a further modification, an anti-ferromagnetic layer may be provided only on an extending area extending from the sensing portion of the first ferromagnetic layer 1.

As a furthermore modification, it is possible to provide the magnetoresistive sensor portion of the second present invention with one or more layers for applying the longitudinal bias magnetic field.

In addition to the magnetoresistive sensor portions of the first and second present inventions, one or more layers applying the longitudinal bias magnetic field are provided for stabilization of the magnetoresistive transducer.

The above aspects of the present inventions provide the following advantages.

Since the magnetization of the second ferromagnetic layer is weakly pinned in a direction perpendicular to the signal magnetic field, for which reason no magnetic polarization process in the direction parallel to the signal magnetic field is required whereby the top and bottom shielding layers and top and bottom magnetic pole layers may be made of various materials freely selected. This improves the performance of the magnetoresistive head and also reduces the cost thereof.

Since the first and second ferromagnetic layers are different in rotation of magnetization, it is not essential to apply a transverse magnetic field. This makes the manufacturing process simple and also improves the productivity.

Since the magnetic pole caused at the track edge of the first ferromagnetic layer applies substantially the longitudinal bias magnetic field to the second ferromagnetic layer, there is no need to provide any further layer for applying the longitudinal bias magnetic field to the second ferromagnetic layer. This makes the manufacturing process simple and also improves the productivity.

It is, however, possible to provide a layer applying the longitudinal bias magnetic field to the first and second ferromagnetic layer. In this case, the resistance curve can be shifted by applying the transverse bias magnetic field so that the dynamic range is widen. Particularly, the transverse bias magnetic field is applied in the saturation state to stabilize the shifting of the resistance curve whereby a relatively low current density allows the linear property of the head.

It is also possible to provide a layer applying the longitudinal bias magnetic field to the second ferromagnetic layer. In this case, the longitudinal bias magnetic field is applied in the saturation state to stabilize the first ferromagnetic layer in the single domain state. The head is free from Barkhausen noise.

Figure 10:
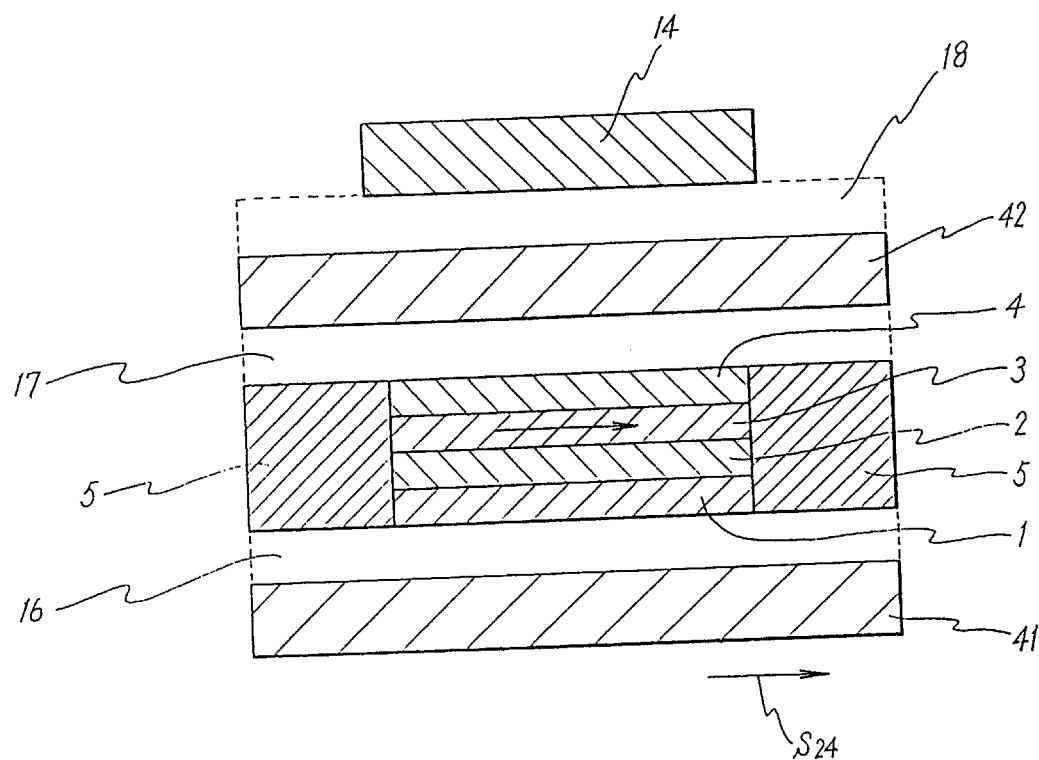

FIRST EMBODIMENT:

A first embodiment according to the present invention will be described in detail with reference to FIG. 10 illustrative of a novel magnetoresistive sensor utilizing the giant magnetoresistance effect for sensing signal magnetic fields of FIG. 3. The magnetoresistive head comprises the following elements. A bottom shielding layer 41 is provided which is formed on a non-magnetic substrate not illustrated such as ceramic substrate. The bottom shielding layer 41 may have a thickness of 2 micrometers and may be made of NiFe. The bottom shielding layer 41 may be formed by plating method and subsequent ion-milling to pattern the same at a width of 60 micrometers.

A bottom shielding gap layer 16 is deposited by a sputtering method on the bottom shielding layer 41. The bottom shielding gap layer 16 may be made of $Al_2O_3$ and have a thickness of 0.1 micrometer. A first ferromagnetic layer 1 made of NiFe and having a thickness of 6 nanometers is deposited by a sputtering method on the bottom shielding gap layer 16. A non-magnetic metal layer 2 made of Cu and having a thickness of 2.5 nanometers is deposited by a sputtering method on the first ferromagnetic layer 1. A second ferromagnetic layer 3 made of NiFe and having a thickness of 6 nanometers is deposited by a sputtering method on the non-magnetic metal layer 2. An anti-ferromagnetic layer 4 made of NiMn and having a thickness of 30 nanometers is deposited by a sputtering method on the second ferromagnetic layer 3.

During application of the magnetic field of 10 kOe in the track width direction S24, a heat treatment is made at 300° C. so that the alternating magnetic field is applied in the track width direction S24 to the second ferromagnetic layer 3. After a stencil resist is provided, the above laminations of the first ferromagnetic layer 1, the non-magnetic metal layer 2, the second ferromagnetic layer 3 and the anti-ferromagnetic layer 4 are patterned by ion milling to have a width of 2 micrometers. Electrodes 5 made of Au and having a thickness of 0.2 micrometers are deposited by sputtering method to form the electrodes 5 at opposite sides of the laminations. The used resist is then removed thereafter.

Subsequently, a top shielding gap layer 17 made of $Al_2O_3$ and have a thickness of 0.1 micrometer is deposited by a sputtering method over the above laminations and the electrodes 5.

Further, a top shielding layer 42 made of NiFe and having a thickness of 2 micrometers is formed by plating method over the top shielding gap layer 17. The top shielding layer 42 is then patterned by ion milling method to have a width of 60 micrometers. A recording gap layer 18 made of $Al_2O_3$ and have a thickness of 0.3 micrometers is formed over the top shielding layer 42. A Coil not illustrated is formed. A top pole layer 14 made of NiFe and have a thickness of 4 micrometers is formed over the recording gap layer 18. As a result, recording portion of the head is formed.

The magnetoresistive head of the first embodiment is tested to confirm that the magnetoresistive head has a superior linear responsiveness and exhibits a high output and symmetrical good reproduced waveforms.

SECOND EMBODIMENT:

A second embodiment according to the present invention will be described in detail with reference to FIG. 11 illustrative of a novel magnetoresistive sensor utilizing the giant magnetoresistance effect for sensing signal magnetic fields. The magnetoresistive head comprises the same structure as in the first embodiment expect for the lamination structures disposed between the electrodes 5. A first ferromagnetic layer 1 made of NiFe and having a thickness of 6 nanometers is deposited by a sputtering method on the bottom shielding gap layer 16. A non-magnetic metal layer 2 made of Cu and having a thickness of 2.5 nanometers is deposited by a sputtering method on the first ferromagnetic layer 1. A hard ferromagnetic layer 7 as the second ferromagnetic layer made of Co and having a thickness of 6 nanometers is deposited by a sputtering method on the non-magnetic metal layer 2.

By application of the magnetic field of 10 kOe in the track width direction S24, the magnetization of the hard magnetic layer 7 is oriented in the track width direction S24. After a stencil resist is provided, the above laminations of the first ferromagnetic layer 1, the non-magnetic metal layer 2 and the hard magnetic layer 7 are patterned by ion milling to have a width of 2 micrometers. Electrodes 5 made of Au and having a thickness of 0.2 micrometers are deposited by sputtering method to form the electrodes 5 at opposite sides of the laminations. The used resist is then removed thereafter.

The magnetoresistive head of the second embodiment is tested to confirm that the magnetoresistive head has a superior linear responsiveness and exhibits a high output and symmetrical good reproduced waveforms.

THIRD EMBODIMENT:

A third embodiment according to the present invention will be described in detail with reference to FIG. 12 illustrative of a novel magnetoresistive sensor utilizing the giant magnetoresistance effect for sensing signal magnetic fields of FIG. 7. The magnetoresistive head comprises the same structure as in the first embodiment expect for the lamination structures disposed between the electrodes 5. A soft magnetic layer 6 made of CoZrMo and having a thickness of 40 nanometers is deposited by a sputtering method on the bottom shielding gap layer 16. A non-magnetic isolation layer 24 made of Ta and having a thickness of 5 nanometers is deposited by a sputtering method on the soft magnetic layer 6. An anti-ferromagnetic layer 4 made of NiMn and having a thickness of 30 nanometers is deposited by a sputtering method on the non-magnetic isolation layer 24. A second ferromagnetic layer 3 made of NiFe and having a thickness of 6 nanometers is deposited by a sputtering method on the anti-ferromagnetic layer 4. A non-magnetic metal layer 2 made of Cu and having a thickness of 2.5 nanometers is deposited by a sputtering method on the second ferromagnetic layer 3. A first ferromagnetic layer 1 made of NiFe and having a thickness of 6 nanometers is deposited by a sputtering method on the non-magnetic metal layer 2.

During application of the magnetic field of 10 kOe in the track width direction S24, a heat treatment is made at 300° C. for applying the second ferromagnetic layer 3 with the alternating magnetic field in the track width direction S24. After a stencil resist is provided, the above laminations of the first ferromagnetic layer 1, the non-magnetic metal layer 2, the second ferromagnetic layer 3, the anti-ferromagnetic layer 4, non-magnetic isolation layer 24 and the soft magnetic layer 6 are patterned by ion milling to have a width of 2 micrometers. Electrodes 5 made of Au and having a thickness of 0.2 micrometers are deposited by sputtering method to form the electrodes 5 at opposite sides of the laminations. The used resist is then removed thereafter.

The magnetoresistive head of the third embodiment is tested to confirm that the magnetoresistive head has a superior linear responsiveness and exhibits a high output and symmetrical good reproduced waveforms.

FOURTH EMBODIMENT:

A fourth embodiment according to the present invention will be described in detail with reference to FIG. 13 illustrative of a novel magnetoresistive sensor utilizing the giant magnetoresistance effect for sensing signal magnetic fields of FIG. 9. The magnetoresistive head comprises the same structure as in the first embodiment expect for the lamination structures disposed between the electrodes 5 and also for permanent magnet layers. A first ferromagnetic layer 1 made of NiFe and having a thickness of 6 nanometers is deposited by a sputtering method on the bottom shielding gap layer 16. A non-magnetic metal layer 2 made of Cu and having a thickness of 2.5 nanometers is deposited by a sputtering method on the first ferromagnetic layer 1. A second ferromagnetic layer 3 made of NiFe and having a thickness of 6 nanometers is deposited by a sputtering method on the non-magnetic metal layer 2. An anti-ferromagnetic layer 4 made of NiMn and having a thickness of 30 nanometers is deposited by a sputtering method on the second ferromagnetic layer 3.

During application of the magnetic field of 10 kOe in the track width direction S24, a heat treatment is made at 300° C. for applying the second ferromagnetic layer 3 with the alternating magnetic field in the track width direction S24. After a stencil resist is provided, the above laminations of the first ferromagnetic layer 1, the non-magnetic metal layer 2 and the hard magnetic layer 7 are patterned by ion milling to have a width of 2 micrometers. Permanent magnet layers 10 made of CoCrPt and having a thickness of 10 nanometers are deposited by sputtering method for applying the longitudinal bias magnetic field. Further, electrodes 5 made of Au and having a thickness of 0.2 micrometers are deposited by sputtering method to form the electrodes 5 at opposite sides of the laminations. The used resist is then removed thereafter. In order for magnetic polarization of the permanent magnet layers 10, a magnetic field of 10 kOe is applied in the track width direction S25.

The magnetoresistive head of the fourth embodiment is tested to confirm that the magnetoresistive head has a superior linear responsiveness and exhibits a high output and symmetrical good reproduced waveforms.

FIFTH EMBODIMENT:

A fifth embodiment according to the present invention will be described in detail with reference to FIG. 14 illustrative of a novel magnetoresistive sensor utilizing the giant magnetoresistance effect for sensing signal magnetic fields. The magnetoresistive head comprises the same structure as in the first embodiment expect for the lamination structures disposed between the electrodes 5. A first anti-ferromagnetic layer 4 made of NiMn and having a thickness of 30 nanometers is deposited by a sputtering method on the bottom shielding gap layer 16. A second ferromagnetic layer 3 made of NiFe and having a thickness of 6 nanometers is deposited by a sputtering method on the anti-ferromagnetic layer 4. During application of the magnetic field of 10 kOe in the track width direction S24, a heat treatment is made at 300° C. for applying the second ferromagnetic layer 3 with the alternating magnetic field in the track width direction S24. A non-magnetic metal layer 2 made of Cu and having a thickness of 2.5 nanometers is deposited by a sputtering method on the second ferromagnetic layer 3. A first ferromagnetic layer 1 made of NiFe and having a thickness of 6 nanometers is deposited by a sputtering method on the non-magnetic metal layer 2. A second anti-ferromagnetic layer 8 made of NiMn and having a thickness of 30 nanometers is deposited by a sputtering method on the first ferromagnetic layer 1 under application of the magnetic field of 1 kOe in the track width direction S25 so that the second ferromagnetic layer 3 is applied with the alternating magnetic field in the track width direction S24.

After a stencil resist is provided, the above laminations of the first ferromagnetic layer 1, the non-magnetic metal layer 2, the second ferromagnetic layer 3, the first anti-ferromagnetic layer 4, and the second anti-ferromagnetic layer 8 are patterned by ion milling to have a width of 2 micrometers. Electrodes 5 made of Au and having a thickness of 0.2 micrometers are deposited by sputtering method to form the electrodes 5 at opposite sides of the laminations. The used resist is then removed thereafter.

The magnetoresistive head of the fifth embodiment is tested to confirm that the magnetoresistive head has a superior linear responsiveness and exhibits a high output and symmetrical good reproduced waveforms.

SIXTH EMBODIMENT:

A sixth embodiment according to the present invention will be described in detail with reference to FIG. 15 illustrative of a novel magnetoresistive sensor utilizing the giant magnetoresistance effect for sensing signal magnetic fields. The magnetoresistive head comprises the same structure as in the first embodiment expect for the lamination structures disposed between the electrodes 5. A first anti-ferromagnetic layer 4 made of NiMn and having a thickness of 30 nanometers is deposited by a sputtering method on the bottom shielding gap layer 16. A second ferromagnetic layer 3 made of NiFe and having a thickness of 6 nanometers is deposited by a sputtering method on the anti-ferromagnetic layer 4. A non-magnetic metal layer 2 made of Cu and having a thickness of 2.5 nanometers is deposited by a sputtering method on the second ferromagnetic layer 3. A first ferromagnetic layer 1 made of NiFe and having a thickness of 6 nanometers is deposited by a sputtering method on the non-magnetic metal layer 2. During application of the magnetic field of 10 kOe in the track width direction S24, a heat treatment is made at 300° C. for applying the second ferromagnetic layer 3 with the alternating magnetic field in the track width direction S24. A second anti-ferromagnetic layer 8 made of NiMn and having a thickness of 30 nanometers is deposited by a sputtering method on the first ferromagnetic layer 1 under application of the magnetic field of 1 kOe in the track width direction S25 so that the second ferromagnetic layer 3 is applied with the alternating magnetic field in the track width direction S25. An electrode layer 5 made of Au and having a thickness of 0.2 micrometers is deposited by sputtering method to form the electrodes 5 over the laminations.

After a stencil resist is provided, the above laminations of the second anti-ferromagnetic layer 8 and the electrode layer are patterned by ion milling to remove those layers from the track portion.

The magnetoresistive head of the sixth embodiment is tested to confirm that the magnetoresistive head has a superior linear responsiveness and exhibits a high output and symmetrical good reproduced waveforms.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A magnetoresistive transducer showing a giant magnetoresistance effect, said magnetoresistive transducer having a multi-layer structure comprising: first and second ferromagnetic layers separated by a non-magnetic layer; and an anti-ferromagnetic layer adjacent to said second ferromagnetic layer, wherein said anti-ferromagnetic layer pins magnetization of said second ferromagnetic layer in a direction perpendicular to a direction of a signal magnetic field, so that magnetizations of said first and second ferromagnetic layers have components perpendicular to said signal magnetic field and those components are anti-parallel to each other.

2. The magnetoresistive transducer as claimed in claim 1, wherein said second ferromagnetic layer has a track edge at which a magnetic pole is caused for generating a longitudinal bias magnetic field which keeps said first ferromagnetic layer in a single domain state.

3. The magnetoresistive transducer as claimed in claim 1, wherein said first ferromagnetic layer is thinner in thickness than said second ferromagnetic layer.

4. The magnetoresistive transducer as claimed in claim 1, wherein said anti-ferromagnetic layer may be made of one selected from the group consisting of materials mainly including at least one of FeMn, NiMn and IrMn, and materials mainly including at least one of NiO, CoO and FeO.

5. The magnetoresistive transducer as claimed in claim 1, wherein at least a permanent magnet layer is provided adjacent to said second ferromagnetic layer for pinning magnetization of said second ferromagnetic layer in said direction perpendicular to said direction of said signal magnetic field.

6. The magnetoresistive transducer as claimed in claim 5, wherein said at least permanent magnet layer may be made of one selected from the group consisting of alloys including at least one of Co, Cr and Pt.

7. The magnetoresistive transducer as claimed in claim 1, wherein said second ferromagnetic layer comprises a hard magnetic layer.

8. The magnetoresistive transducer as claimed in claim 7, wherein said hard magnetic layer may be made of one selected from the group consisting of Co and Co-based alloys.

9. The magnetoresistive transducer as claimed in claim 1, wherein a magnetic field applied for pinning magnetization of said second ferromagnetic layer in said direction perpendicular to said direction of said signal magnetic field is in the range of 80–160 Oe.

10. The magnetoresistive transducer as claimed in claim 1, wherein at least an electrically conductive material is provided in the vicinity of said second ferromagnetic layer for pinning magnetization of said second ferromagnetic layer in said direction perpendicular to said direction of said signal magnetic field.

11. The magnetoresistive transducer as claimed in claim 1, wherein each of said first and second ferromagnetic layers is made of one selected from the group consisting of Fe, Co, Ni, and alloys based upon at least one of Fe, Co and Ni.

12. The magnetoresistive transducer as claimed in claim 1, wherein said non-magnetic layer may be made of one selected from the group consisting of Cu, Ag, Au, and alloys based upon at least one of Cu, Ag and Au.

13. The magnetoresistive transducer as claimed in claim 1, further comprising means provided in the vicinity of said first and second ferromagnetic layers for applying a transverse bias magnetic field to said first and second ferromagnetic layers.

14. The magnetoresistive transducer as claimed in claim 13, wherein said means is positioned in the same side as said second ferromagnetic layer with reference to said non-magnetic layer.

15. The magnetoresistive transducer as claimed in claim 13, wherein said means comprises laminations of a soft magnetic layer and a non-magnetic layer.

16. The magnetoresistive transducer as claimed in claim 13, wherein said means comprises a non-magnetic metal layer.

17. The magnetoresistive transducer as claimed in claim 13, wherein said means comprises a permanent magnet layer.

18. The magnetoresistive transducer as claimed in claim 1, further comprising means being provided adjacent to said first ferromagnetic layer for applying a longitudinal magnetic field.

19. The magnetoresistive transducer as claimed in claim 18, wherein a direction of said longitudinal magnetic field is anti-parallel to a direction toward which said magnetization of said second ferromagnetic layer is pinned.

20. The magnetoresistive transducer as claimed in claim 18, wherein said means comprises at least a permanent magnet layer.

21. The magnetoresistive transducer as claimed in claim 18, wherein said means is provided in contact directly with said first ferromagnetic layer.

22. The magnetoresistive transducer as claimed in claim 18, wherein said means comprises an anti-ferromagnetic layer in contact directly with said first ferromagnetic layer except at sensing portion.

23. A multi-layer structure showing a giant magnetoresistance effect, comprising first and second ferromagnetic layers separated by a non-magnetic layer; and an anti-ferromagnetic layer adjacent to said second ferromagnetic layer,
wherein said anti-ferromagnetic layer pins magnetization of said second ferromagnetic layer in a direction perpendicular to a direction of a signal magnetic field, so that magnetizations of said first and second ferromagnetic layers have components perpendicular to said signal magnetic field and those components are anti-parallel to each other.

24. The multi-layer structure as claimed in claim 23, wherein said second ferromagnetic layer has a track edge at which a magnetic pole is caused for generating a longitudinal bias magnetic field which keeps said first ferromagnetic layer in a single domain state.

25. The multi-layer structure as claimed in claim 23, wherein a resistance of said multi-layer structure varies mainly dependent upon a magnetization rotation of said second ferromagnetic layer.

26. The multi-layer structure as claimed in claim 23, wherein said first ferromagnetic layer is thinner in thickness than said second ferromagnetic layer.

27. The multi-layer structure as claimed in claim 23, wherein said anti-ferromagnetic layer may be made of one selected from the group consisting of materials mainly including at least one of FeMn, NiMn and IrMn, and materials mainly including at least one of NiO, CoO and FeO.

28. The multi-layer structure as claimed in claim 23, wherein at least a permanent magnet layer is provided adjacent to said second ferromagnetic layer for pinning magnetization of said second ferromagnetic layer in said direction perpendicular to said direction of said signal magnetic field.

29. The multi-layer structure as claimed in claim 28, wherein said at least permanent magnet layer may be made of one selected from the group consisting of alloys including at least one of Co, Cr and Pt.

30. The multi-layer structure as claimed in claim 23, wherein said second ferromagnetic layer comprises a hard magnetic layer.

31. The multi-layer structure as claimed in claim 30, wherein said hard magnetic layer may be made of one selected from the group consisting of Co and Co-based alloys.

32. The multi-layer structure as claimed in claim 23, wherein a magnetic field applied for pinning magnetization of said second ferromagnetic layer in said direction perpendicular to said direction of said signal magnetic field is in the range of 80–160 Oe.

33. The multi-layer structure as claimed in claim 23, wherein at least an electrically conductive material is provided in the vicinity of said second ferromagnetic layer for pinning magnetization of said second ferromagnetic layer in said direction perpendicular to said direction of said signal magnetic field.

34. The multi-layer structure as claimed in claim 23, wherein each of said first and second ferromagnetic layers is made of one selected from the group consisting of Fe, Co, Ni, and alloys based upon at least one of Fe, Co and Ni.

35. The multi-layer structure as claimed in claim 23, wherein said non-magnetic layer may be made of one selected from the group consisting of Cu, Ag, Au, and alloys based upon at least one of Cu, Ag and Au.

36. The multi-layer structure as claimed in claim 23, further comprising means provided in the vicinity of said first and second ferromagnetic layers for applying a transverse bias magnetic field to said first and second ferromagnetic layers.

37. The multi-layer structure as claimed in claim 36, wherein said means is positioned in the same side as said second ferromagnetic layer with reference to said non-magnetic layer.

38. The multi-layer structure as claimed in claim 36, wherein said means comprises laminations of a soft magnetic layer and a non-magnetic layer.

39. The multi-layer structure as claimed in claim 36, wherein said means comprises a non-magnetic metal layer.

40. The multi-layer structure as claimed in claim 36, wherein said means comprises a permanent magnet layer.

41. The multi-layer structure as claimed in claim 23, further comprising means being provided adjacent to said first ferromagnetic layer for applying a longitudinal magnetic field.

42. The multi-layer structure as claimed in claim 41, wherein a direction of said longitudinal magnetic field is anti-parallel to a direction toward which said magnetization of said second ferromagnetic layer is pinned.

43. The multi-layer structure as claimed in claim 41, wherein said means comprises at least a permanent magnet layer.

44. The multi-layer structure as claimed in claim 41, wherein said means is provided in contact directly with said first ferromagnetic layer.

45. The multi-layer structure as claimed in claim 41, wherein said means comprises an anti-ferromagnetic layer in contact directly with said first ferromagnetic layer except at sensing portion.

46. A method of using a magnetoresistive transducer showing a giant magnetoresistance effect and having a multi-layer structure comprising first and second ferromagnetic layers separated by a non-magnetic layer and an anti-ferromagnetic layer adjacent to the second ferromagnetic layer, wherein said anti-ferromagnetic layer pins magnetization of said second ferromagnetic layer in a direction perpendicular to a direction of a signal magnetic field, so that magnetizations of said first and second ferromagnetic layers have components perpendicular to said signal magnetic field and those components are anti-parallel to each other, and said magnetoresistive transducer is used in a saturation state saturated by a current magnetic field.

47. A method of using a magnetoresistive transducer showing a giant magnetoresistance effect and having a multi-layer structure comprising first and second ferromagnetic layers separated by a non-magnetic layer and an anti-ferromagnetic layer adjacent to the second ferromagnetic layer, wherein said anti-ferromagnetic layer pins magnetization of said second ferromagnetic layer in a direction perpendicular to a direction of a signal magnetic field, so that magnetizations of said first and second ferromagnetic layers have components perpendicular to said signal magnetic field and those components are anti-parallel to each other, and said magnetoresistive transducer is used in a saturation state saturated by a transverse bias magnetic field.

* * * * *